(12) United States Patent
Toyoda et al.

(10) Patent No.: US 11,477,925 B2
(45) Date of Patent: Oct. 18, 2022

(54) ELECTROMAGNETIC WAVE ABSORBING SHEET

(71) Applicant: Maxell, Ltd., Kyoto (JP)

(72) Inventors: Masayuki Toyoda, Kyoto (JP); Masao Fujita, Kyoto (JP)

(73) Assignee: MAXELL, LTD., Kyoto (JP)

( * ) Notice: Subject to any disclaimer, the term of this patent is extended or adjusted under 35 U.S.C. 154(b) by 0 days.

(21) Appl. No.: 16/476,842

(22) PCT Filed: Jan. 5, 2018

(86) PCT No.: PCT/JP2018/000125
§ 371 (c)(1),
(2) Date: Jul. 9, 2019

(87) PCT Pub. No.: WO2018/163584
PCT Pub. Date: Sep. 13, 2018

(65) Prior Publication Data
US 2020/0146191 A1 May 7, 2020

(30) Foreign Application Priority Data
Mar. 10, 2017 (JP) .............................. JP2017-046341

(51) Int. Cl.
*H05K 9/00* (2006.01)
*B32B 5/02* (2006.01)
(Continued)

(52) U.S. Cl.
CPC ............. *H05K 9/0086* (2013.01); *B32B 5/02* (2013.01); *B32B 15/09* (2013.01); *B32B 15/20* (2013.01);
(Continued)

(58) Field of Classification Search
CPC ........................... H05K 9/0086; H05K 9/0094
See application file for complete search history.

(56) References Cited

U.S. PATENT DOCUMENTS

| 9,168,777 B2 * | 10/2015 | Chun ................... B41N 1/06 |
| 2002/0037399 A1 * | 3/2002 | Tamai ................... H01B 1/20 |
| | | 428/328 |

(Continued)

FOREIGN PATENT DOCUMENTS

| CN | 101309965 A | 11/2008 | |
| CN | 109754949 A * | 4/2019 | ............. H01B 13/00 |

(Continued)

OTHER PUBLICATIONS

International Search Report for PCT/JP2018/000125 dated Mar. 20, 2018.
(Continued)

*Primary Examiner* — Hung V Ngo
(74) *Attorney, Agent, or Firm* — Birch, Stewart, Kolasch & Birch, LLP

(57) ABSTRACT

Provided is an electromagnetic-wave interference type electromagnetic-wave absorbing sheet that can favorably absorb electromagnetic waves in a desired frequency band while having high flexibility and light transmittance and being handled easily. The electromagnetic-wave absorbing sheet having flexibility and light transmittance includes an electric resistance film 1, a dielectric layer 2 and an electromagnetic-wave shielding layer 3 that each have light transmittance and that are stacked. The electric resistance film is formed of a conductive organic polymer, and the electromagnetic-wave shielding layer has an aperture ratio of 35% or more and 85% or less.

8 Claims, 3 Drawing Sheets

(51) Int. Cl.
  *B32B 15/09*   (2006.01)
  *B32B 15/20*   (2006.01)
  *B32B 27/36*   (2006.01)

(52) U.S. Cl.
  CPC ........... *B32B 27/36* (2013.01); *H05K 9/0088* (2013.01); *H05K 9/0094* (2013.01); *B32B 2255/10* (2013.01); *B32B 2255/26* (2013.01); *B32B 2307/202* (2013.01); *B32B 2307/212* (2013.01)

(56) References Cited

U.S. PATENT DOCUMENTS

| | | | | |
|---|---|---|---|---|
| 2007/0196671 | A1* | 8/2007 | Kobayashi | B82Y 25/00 428/447 |
| 2007/0212536 | A1* | 9/2007 | Okada | C09D 5/24 428/345 |
| 2007/0272439 | A1* | 11/2007 | Kim | H05K 9/0092 174/389 |
| 2009/0104440 | A1* | 4/2009 | Nashiki | G06F 3/045 428/336 |
| 2009/0120775 | A1 | 5/2009 | Morita et al. | |
| 2009/0284475 | A1* | 11/2009 | Nashiki | G06F 3/045 345/173 |
| 2010/0090879 | A1* | 4/2010 | Janis | H01Q 17/00 342/1 |
| 2010/0177397 | A1* | 7/2010 | Kamiyama | G02B 5/02 359/609 |
| 2012/0237729 | A1* | 9/2012 | Ozawa | C08J 7/0427 428/147 |
| 2013/0163150 | A1 | 6/2013 | Nobuta et al. | |
| 2013/0294037 | A1* | 11/2013 | Kuriki | H05K 9/00 361/748 |
| 2014/0131079 | A1* | 5/2014 | Byun | C09D 11/52 174/257 |
| 2014/0340811 | A1 | 11/2014 | Pschenitzka | |
| 2017/0058167 | A1* | 3/2017 | Matsubayashi | C08J 7/0427 |
| 2018/0319138 | A1 | 11/2018 | Ukei et al. | |
| 2018/0332742 | A1 | 11/2018 | Yamagata et al. | |
| 2020/0413578 | A1 | 12/2020 | Toyoda | |

FOREIGN PATENT DOCUMENTS

| | | |
|---|---|---|
| JP | 4-149267 A | 5/1992 |
| JP | 6-120689 A | 4/1994 |
| JP | 8-307088 A | 11/1996 |
| JP | 9-232787 A | 9/1997 |
| JP | 2000-59066 A | 2/2000 |
| JP | 2000-216587 A | 8/2000 |
| JP | 2003-124011 A | 4/2003 |
| JP | 2003-198179 A | 7/2003 |
| JP | 2004-259910 A | 9/2004 |
| JP | 2006-86446 A | 3/2006 |
| JP | 2006-120836 A | 5/2006 |
| JP | 2008-135485 A | 6/2008 |
| JP | 2009-239211 A | 10/2009 |
| JP | 2011-152667 A | 8/2011 |
| JP | 2013-16670 A | 1/2013 |
| JP | 2013-201359 A | 10/2013 |
| JP | 2014-185303 A | 10/2014 |
| JP | 2015-173010 A | 10/2015 |
| JP | 2016-3312 A | 1/2016 |
| JP | 2017-43765 A | 3/2017 |
| JP | 2017-112373 A | 6/2017 |
| JP | 2017-163141 A | 9/2017 |

OTHER PUBLICATIONS

Extended European Search Report for European Application No. 18763338.3, dated Dec. 16, 2020.
Japanese Office Action for Japanese Application No. 2019-084459, dated Dec. 14, 2021, with an English translation.
Chinese Office Action and Search Report for Chinese Application No. 201780067532.9, dated Mar. 16, 2020, with a partial English translation.
International Search Report for International Application No. PCT/JP2017/040470, dated Feb. 13, 2018.
International Search Report for International Application No. PCT/JP2018/033662, dated Dec. 18, 2018, with an English translation.
Japanese Office Action for Japanese Application No. 2018-519068, dated Nov. 6, 2018.
U.S. Appl. No. 16/348,713, filed Jul. 11, 2019.
U.S. Appl. No. 16/620,778, filed Dec. 9, 2019.

* cited by examiner

ELECTROMAGNETIC WAVE ABSORBING SHEET

TECHNICAL FIELD

The present disclosure relates to an electromagnetic-wave absorbing sheet having flexibility and light transmittance and absorbing electromagnetic waves in a millimeter-wave band from several tens of gigahertz (GHz) to several hundreds gigahertz (GHz) or electromagnetic waves in a still higher frequency band.

BACKGROUND ART

Electromagnetic-wave absorbing sheets for absorbing electromagnetic waves have been used to avoid influences of leaked electromagnetic waves to be emitted to the outside from electric circuits and influences of undesirably reflected electromagnetic waves.

Recently, researches on technologies of utilizing high frequency electromagnetic waves, including centimeter waves having a frequency of several gigahertz (GHz), millimeter waves having a frequency of 30 GHz to 300 GHz, and electromagnetic waves having a still higher frequency of one terahertz (THz) as electromagnetic waves in a high frequency band above the millimeter-wave band, have proceeded for mobile communications such as mobile phones, wireless LAN and electric toll collection system (ETC).

There will be a growing demand, in response to such a technical trend of utilizing electromagnetic waves of high frequencies, that electromagnetic-wave absorbers for absorbing unnecessary electromagnetic waves and electromagnetic-wave absorbing sheets, which are sheet-shaped electromagnetic-wave absorbers that provides higher user convenience, can absorb electromagnetic waves in a frequency band equal to or higher than the millimeter-wave band.

As such electromagnetic-wave absorbing sheets, electromagnetic-wave interference type (λ/4 type) electromagnetic-wave absorbing sheets are known. In the electromagnetic-wave interference type electromagnetic-wave absorbing sheets, an electric resistance film is formed on one surface of a dielectric layer and an electromagnetic-wave shielding layer that reflects electromagnetic waves is formed on the other surface of the dielectric layer. Electromagnetic waves are absorbed by shifting the phase of reflected waves with respect to the phase of incident waves by ½ wavelength to make the incident waves and the reflected waves cancel each other out. The electromagnetic-wave interference type electromagnetic-wave absorbing sheets can be produced easily and are lightweight as compared with electromagnetic-wave absorbing sheets that magnetically absorb electromagnetic waves by magnetic particles with large specific gravity, and thus are advantageous in cost reduction.

Conventionally, in the electromagnetic-wave interference type electromagnetic-wave absorbing sheets (electromagnetic-wave absorbers), the electric resistance film on one surface of the dielectric layer is formed by ion plating, vacuum evaporation, sputtering or the like, using metal oxide such as indium tin oxide (ITO), indium oxide, stannic oxide or zinc oxide, metal nitride, or a mixture of these (see Patent Document 1, Patent Document 2).

Further, Patent Document 3 proposes an electromagnetic-wave interference type electromagnetic-wave absorber having flame resistance and light transmittance, which includes a resistance layer made of a transparent conductive material such as indium tin oxide (ITO) film, a transparent dielectric layer made of glass, acrylic resin or the like, and a reflective film made of metal such as silver, gold, copper or aluminum that is formed on the dielectric layer.

PRIOR ART DOCUMENTS

Patent Documents

Patent Document 1: JP H06(1994)-120689 A
Patent Document 2: JP H09(1997)-232787 A
Patent Document 3: JP 2006-086446 A

DISCLOSURE OF INVENTION

Problem to be Solved by the Invention

In the conventional electromagnetic-wave absorbing sheets and electromagnetic-wave absorbers, the electric resistance film formed on the surface of the dielectric layer has a function of matching the surface impedance of the electromagnetic-wave absorbing sheet to the impedance in the air to enable electromagnetic waves to easily enter the electromagnetic-wave absorbing sheet. Therefore, it is necessary to keep the surface electric resistance of the electric resistance film close to a vacuum permittivity of 377 Ω/sq (sheet resistance).

On the other hand, in the electromagnetic-wave interference type electromagnetic-wave absorbing sheets, since the dielectric layer is thinned as the frequency of electromagnetic waves to be absorbed increases, the sheets can have high flexibility. The thin and bendable electromagnetic-wave absorbing sheets can be attached to various places and improve the convenience of users, but they are more likely to be bent strongly by users. In such electromagnetic-wave absorbing sheets, the electric resistance film formed by sputtering or the like using metal oxide cracks easily by being bent strongly, and the surface electric resistance increases. This collapses impedance matching and deteriorates the electromagnetic-wave absorbing properties.

Moreover, electromagnetic-wave absorbing sheets having light transmittance and flexibility have not been realized conventionally.

It is an object of the present disclosure to provide an electromagnetic-wave absorbing sheet that can solve the above conventional problem, specifically, to provide an electromagnetic-wave interference type electromagnetic-wave absorbing sheet that can favorably absorb electromagnetic waves in a desired frequency band while having high flexibility and light transmittance and being handled easily.

Means for Solving Problem

In order to solve the above problem, an electromagnetic-wave absorbing sheet disclosed in the present application is an electromagnetic-wave absorbing sheet having flexibility and light transmittance, including an electric resistance film, a dielectric layer and an electromagnetic-wave shielding layer that each have light transmittance and that are stacked sequentially. The electric resistance film is formed of a conductive organic polymer. The electromagnetic-wave shielding layer has an aperture ratio of 35% or more and 85% or less.

Effects of the Invention

Since the electric resistance film of the electromagnetic-wave absorbing sheet disclosed in the present application is formed of a conductive organic polymer, the electric resistance film does not crack even when the sheet is bent strongly, and thus the sheet can maintain the impedance matching and keep high electromagnetic-wave absorbing properties. Further, since the electric resistance film, the dielectric layer and the electromagnetic-wave shielding layer each have light transmittance, the electromagnetic-wave absorbing sheet has light transmittance. Thus, it is possible to constitute an electromagnetic-wave absorbing sheet having high flexibility, light transmittance and favorable electromagnetic-wave absorbing properties at low cost.

DESCRIPTION OF THE INVENTION

Figure 1:
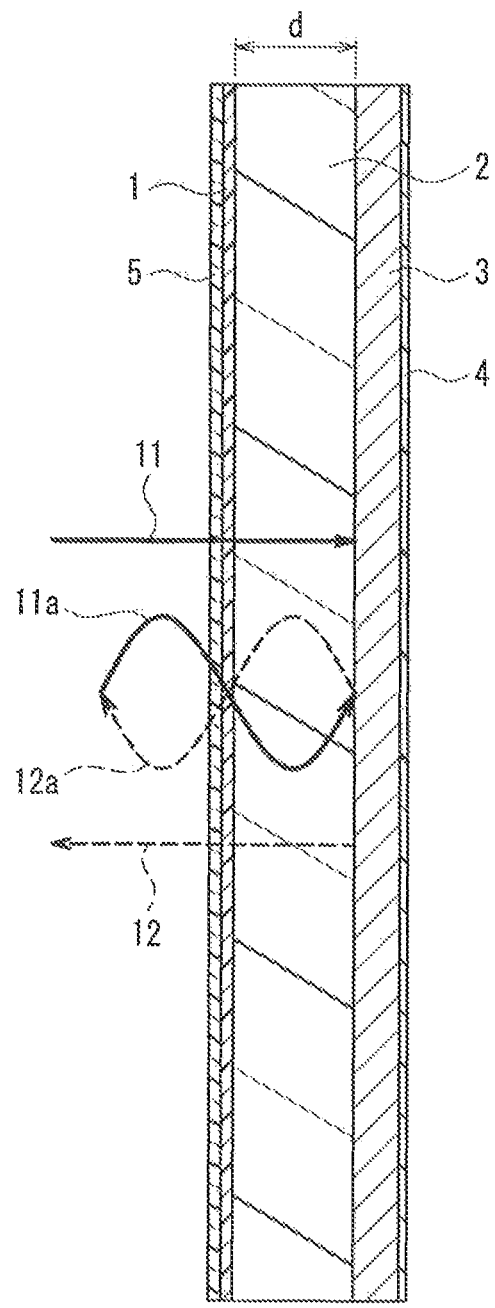
FIG. 1 is a cross-sectional view illustrating the configuration of an electromagnetic-wave absorbing sheet of this embodiment.

An electromagnetic-wave absorbing sheet disclosed in the present application is an electromagnetic-wave absorbing sheet having flexibility and light transmittance, including an electric resistance film, a dielectric layer and an electromagnetic-wave shielding layer that each have light transmittance and that are stacked. The electric resistance film is formed of a conductive organic polymer. The electromagnetic-wave shielding layer has an aperture ratio of 35% or more and 85% or less.

By doing so, the electromagnetic-wave absorbing sheet disclosed in the present application, which is an electromagnetic-wave interference type electromagnetic-wave absorbing sheet in which an electric resistance film, a dielectric layer and an electromagnetic-wave shielding layer are stacked, is less likely to have a problem of cracks or the like on the electric resistance film even when the sheet is bent strongly, thereby maintaining the impedance matching and exhibiting high electromagnetic-wave absorbing properties. Further, since the electric resistance film, the dielectric layer and the electromagnetic-wave shielding layer each have light transmittance, and the electromagnetic-wave shielding layer has a surface electric resistance high enough to function as an electromagnetic-wave reflective layer, it is possible to constitute an electromagnetic-wave absorbing sheet having light transmittance as a whole and not obstructing a view.

In the electromagnetic-wave absorbing sheet disclosed in the present application, it is preferred that the electromagnetic-wave shielding layer is formed of a conductive mesh. By doing so, the electromagnetic-wave shielding layer has a surface electric resistance high enough to function as an electromagnetic-wave reflective layer, and it is possible to constitute an electromagnetic-wave absorbing sheet having light transmittance with less haze.

Further, it is preferred that a surface electric resistance of the electromagnetic-wave shielding layer is 0.3 Ω/sq or less.

In the electromagnetic-wave absorbing sheet disclosed in the present application, it is preferred that the electric resistance film contains poly(3,4-ethylenedioxythiophene) (PEDOT). By doing so, it is possible to easily obtain a surface film having a desired surface electric resistance.

In this case, it is preferred that the electric resistance film further contains polystyrene sulfonic acid (PSS) and polyvinylidene fluoride (PVDF). The polystyrene sulfonic acid functions as a counter anion of poly(3,4-ethylenedioxythiophene) and stabilizes the electric resistance of the electric resistance film. Thereby, it is possible to more easily adjust the surface electric resistance of the electric resistance film.

Further, it is preferred that the electric resistance film contains water-soluble polyester. By doing so, the electric resistance film itself can have high weather resistance, and it is possible to constitute a highly reliable electromagnetic-wave absorbing sheet with stable surface electric resistance.

Further, it is preferred that a surface electric resistance of the electric resistance film is in a range from −15% to +20% with respect to a vacuum impedance (377Ω). By doing so, it is possible to obtain an electromagnetic-wave absorbing sheet that achieves proper impedance matching to exhibit sufficiently high electromagnetic-wave absorbing properties in practical use.

Further, in the electromagnetic-wave absorbing sheet disclosed in the present application, it is preferred that a thickness of the dielectric layer is set so that the dielectric layer can absorb electromagnetic waves in a high frequency band equal to or higher than a millimeter-wave band. By doing so, it is possible to constitute an electromagnetic-wave absorbing sheet having high flexibility and light transmittance that can absorb electromagnetic waves in a frequency band equal to or higher than the millimeter-wave band.

Hereinafter, the electromagnetic-wave absorbing sheet disclosed in the present application will be described with reference to the drawings.

The term "electric waves" can be understood as one type of electromagnetic waves in a broader sense, and therefore the present specification uses the term "electromagnetic waves" collectively. For example, electric-wave absorbers are referred to as electromagnetic-wave absorbers in the present specification.

Embodiment

First, the overall configuration of an electromagnetic-wave absorbing sheet of this embodiment will be described.

FIG. 1 is a cross-sectional view illustrating the configuration of the electromagnetic-wave absorbing sheet of this embodiment.

FIG. 1 is illustrated for the sake of easy understanding of the configuration of the electromagnetic-wave absorbing sheet of this embodiment, and does not faithfully reflect the actual sizes or thicknesses of members illustrated therein.

The electromagnetic-wave absorbing sheet exemplified in this embodiment is formed by stacking an electric resistance film 1, a dielectric layer 2, and an electromagnetic-wave shielding layer 3. In the electromagnetic-wave absorbing sheet illustrated in FIG. 1, an adhesive layer 4 is stacked on a surface of the electromagnetic-wave shielding layer 3 on a back side, i.e., a side in the electromagnetic-wave shielding layer 3 opposite to a side where the dielectric layer 2 is disposed. A protective layer 5 is stacked on a surface of the electric resistance film 1 on a front side, i.e., a side in the electric resistance film 1 opposite to a side where the dielectric layer 2 is disposed.

In the electromagnetic-wave absorbing sheet of this embodiment, electromagnetic waves 11 incident upon the dielectric layer 2 are reflected at an interface between the dielectric layer 2 and the electromagnetic-wave shielding layer 3 that is disposed on the back side of the dielectric layer 2, and emitted to the outside as reflected waves 12. By adjusting a thickness d of the dielectric layer 2 to ¼ the wavelength of incident electromagnetic waves (d=λ/4), a phase 11a of the incident waves 11 and a phase 12a of the reflected waves 12 are canceled each other out, whereby electromagnetic waves incident upon the electromagnetic-wave absorbing sheet are absorbed.

The above formula d=λ/4 is established when the dielectric layer 2 is air (permittivity ε=1). When the dielectric layer 2 is a dielectric having permittivity $\varepsilon_r$, a formula $d=1/(4\sqrt{\varepsilon_r})$ is established, and the thickness d of the dielectric layer 2 can be reduced by $1/(4\sqrt{\varepsilon_r})$. Such a reduction in the thickness of the dielectric layer 2 can reduce the thickness of the electromagnetic-wave absorbing sheet as a whole, whereby it is possible to constitute an electromagnetic-wave absorbing sheet having still higher flexibility.

The electromagnetic-wave shielding layer 3, which is stacked on the back side of the dielectric layer 2, reflects incident electromagnetic waves on the surface on the dielectric layer 2 side, i.e., the boundary surface with the dielectric layer 2.

From the principle of electromagnetic-wave absorption in the electromagnetic-wave interference type electromagnetic-wave absorbing sheet of this embodiment, it is necessary that the electromagnetic-wave shielding layer 3 functions as a reflective layer that reflects electromagnetic waves while having flexibility and light transmittance. The electromagnetic-wave shielding layer 3 that satisfies such a demand may be a conductive mesh constituted by conductive fibers, or a conductive grid constituted by conductive wires such as super fine metal wires.

The electric resistance film 1 is formed on a front side of the dielectric layer 2, i.e., a side of the dielectric layer 2 from which electromagnetic waves to be absorbed enter, which is opposite to the side where the electromagnetic-wave shielding layer 3 is stacked. The electric resistance film 1 matches impedances between the electromagnetic-wave absorbing sheet and air.

It is important that the input impedance of the electromagnetic-wave absorbing sheet is close to the impedance in the air of 377Ω (vacuum impedance in practice) when electromagnetic waves propagating through the air enter the electromagnetic-wave absorbing sheet, in order to prevent deterioration of electromagnetic-wave absorbing properties due to reflection or scattering of electromagnetic waves when entering the sheet. In the electromagnetic-wave absorbing sheet of this embodiment, by forming the electric resistance film 1 as a conductive organic polymer film, the electromagnetic-wave absorbing sheet can have flexibility while the electric resistance film 1 does not crack even when the electromagnetic-wave absorbing sheet is strongly bent. Thereby, the surface electric resistance does not change, and favorable impedance matching can be maintained.

The adhesive layer 4 formed on the back side of the electromagnetic-wave shielding layer 3 makes the electromagnetic-wave absorbing sheet easily attachable to a predetermined position. The adhesive layer 4 can be formed easily by application of an adhesive resin paste.

The adhesive layer 4 is not an essential member in the electromagnetic-wave absorbing sheet of this embodiment. In an arrangement of the electromagnetic-wave absorbing sheet to a predetermined position, a member for adhesion may be arranged on a member on which the electromagnetic-wave absorbing sheet is to be attached, or an adhesive may be supplied or a double-sided tape may be used between the electromagnetic-wave absorbing sheet and an arrangement position.

The protective layer 5 is formed on a front surface of the electric resistance film 1, i.e., an uppermost surface in the electromagnetic-wave absorbing sheet on the electromagnetic-wave incident side, to protect the electric resistance film 1.

The moisture in the air may change the surface electric resistance of the conductive organic polymer constituting the electric resistance film 1 of the electromagnetic-wave absorbing sheet of this embodiment. Further, since the electric resistance film 1 is made of resin, it may be damaged when a sharp member contacts the surface, or a hard material rubs against the surface. To avoid this, it is preferable to protect the electric resistance film 1 by covering the surface of the electric resistance film 1 with the protective layer 5.

The protective layer 5 is not an essential member in the electromagnetic-wave absorbing sheet of this embodiment. Depending on the material of the conductive organic polymer, there is little concern about the change in the surface electric resistance due to the moisture attached to the surface or the damage of the surface of the electric resistance film 1. In this case, the electromagnetic-wave absorbing sheet can be configured without the protective layer 5.

Moreover, the protective layer 5 may be made of a resin material such as polyethylene terephthalate as described later. Although the resin material used as the protective layer 5 has a certain resistance, the influence of the resistance of the protective layer 5 on the surface electric resistance of the electromagnetic-wave absorbing sheet can be reduced to a level having no problem in practical use by setting the thickness of the protective layer 5 thin.

Next, members constituting the electromagnetic-wave absorbing sheet of this embodiment will be described in detail.

[Electric Resistance Film]

In the electromagnetic-wave absorbing sheet of this embodiment, the electric resistance film 1 is formed of a conductive organic polymer.

As the conductive organic polymer, a conjugated conductive organic polymer is used, and preferable examples of which include polythiophene and derivatives thereof and polypyrrole and derivatives thereof.

Specific examples of the polythiophene-based conductive polymer suitably used for the electric resistance film 1 of the electromagnetic-wave absorbing sheet of this embodiment include poly(thiophene), poly(3-methylthiophene), poly(3-ethylthiophene), poly(3-propylthiophene), poly(3-butylthiophene), poly(3-hexylthiophene), poly(3-heptylthiophene), poly(3-octylthiophene), poly(3-decylthiophene), poly(3-dodecylthiophene), poly(3-octadecylthiophene), poly(3-bromothiophene), poly(3-chlorothiophene), poly(3-iodothiophene), poly(3-cyanothiophene), poly(3-phenylthiophene), poly(3,4-dimethylthiophene), poly(3,4-dibutylthiophene), poly(3-hydroxythiophene), poly(3-methoxythiophene), poly(3-ethoxythiophene), poly(3-butoxythiophene), poly(3-hexyloxythiophene), poly(3-heptyloxythiophene), poly(3-octyloxythiophene), poly(3-decyloxythiophene), poly(3-dodecyloxythiophene), poly(3-octadecyloxythiophene), poly(3,4-dihydroxythiophene), poly(3,4-dimethoxythiophene), poly(3,4-diethoxythiophene), poly(3,4-dipmpoxythiophene), poly(3,4-dibutoxythiophene), poly(3,4-dihexyloxythiophene), poly(3,4-diheptyloxythiophene), poly(3,4-dioctyloxythiophene), poly(3,4-didecyloxythiophene), poly(3,4-didodecyloxythiophene), poly(3,4-ethylenedioxythiophene), poly(3,4-propylenedioxythiophene), poly(3,4-butenedioxythiophene), poly(3-methyl-4-methoxythiophene), poly(3-methyl-4-ethoxythiophene), poly(3-carboxythiophene), poly(3-methyl-4-carboxythiophene), poly(3-methyl-4-carboxyethylthiophene), and poly(3-methyl-4-carboxybutylthiophene).

Specific examples of the polypyrrole-based conductive polymer suitably used for the electric resistance film 1 include polypyrrole, poly(N-methylpyrrole), poly(3-methylpyrrole), poly(3-ethylpyrrole), poly(3-n-propylpyrrole), poly(3-butylpyrrole), poly(3-octylpyrrole), poly(3-decylpyrrole), poly(3-dodecylpyrrole), poly(3,4-dimethylpyrrole), poly(3,4-dibutylpyrrole), poly(3-carboxypyrrole), poly(3-methyl-4-carboxypyrrole), poly(3-methyl-4-carboxyethylpyrrole), poly(3-methyl-4-carboxybutylpyrrole), poly(3-hydroxypyrrole), poly(3-methoxypyrrole), poly(3-ethoxypyrrole), poly(3-butoxypyrrole), poly(3-hexyloxypyrrole), poly(3-methyl-4-hexyloxypyrrole), and poly(3-methyl-4-hexyloxypyrrole).

In addition, an organic polymer whose main chain is composed of a conjugated system may be used as the electric resistance film 1. Examples of such an organic polymer include polyacetylene-based conductive polymers, polyphenylene-based conductive polymers, polyphenylene vinylene-based conductive polymers, polyaniline-based conductive polymers, polyacene-based conductive polymers, polythiophene vinylene-based conductive polymers, and copolymers of these.

As the conductive organic polymer used for the electric resistance film, polyanion may be used as a counter anion. Although not particularly limited, it is preferred that the polyanion contains an anion group that enables the conjugated conductive organic polymer used for the electric resistance film to cause chemical oxidation doping. Examples of such an anion group include groups expressed by general formulae —O—SO$_3$X, —O—PO(OX)$_2$, —COOX, and —SO$_3$X (in each formula, X represents a hydrogen atom or an alkali metal atom). Among them, the groups expressed by —SO$_3$X and —O—SO$_3$X are particularly preferred because of their excellent doping effects on the conjugated conductive organic polymer.

Specific examples of the polyanion include: polymers having a sulfonic group such as polystyrene sulfonic acid, polyvinyl sulfonic acid, polyallyl sulfonic acid, polyacryl sulfonic acid, polymethacryl sulfonic acid, poly(2-acrylamide-2-methylpropanesulfonic acid), polyisoprene sulfonic acid, polysulfoethyl methacrylate, poly(4-sulfobutyl methacrylate), and polymethacrylaxybenzene sulfonic acid; and polymers having a carboxylic group such as polyvinyl carboxylic acid, polystyrene carboxylic acid, polyallyl carboxylic acid, polyacryl carboxylic acid, polymethacryl carboxylic acid, poly(2-acrylamide-2-methylpropanecarboxylic acid), polyisoprene carboxylic acid, and polyacrylic acid. The polyanion may be a homopolymer of one of them or a compolymer of two or more of them. One of the polyanions may be used alone, or two or more of the polyanions may be used in combination. Among the polyanions, polymers having a sulfonic group are preferred, and polystyrene sulfonic acid is more preferred.

One of the conductive organic polymers may be used alone, or two or more of the conductive organic polymers may be used in combination. Among the materials exemplified above, polymers composed of one or two selected from polypyrrole, poly(3-methoxythiophene), poly(3,4-ethylenedioxythiophene), poly(2-aniline sulfonic acid), and poly(3-aniline sulfonic acid) are preferred from the viewpoint of enhancing light transmittance and conductivity.

Particularly, it is preferable to use poly(3,4-ethylenedioxythiophene: PEDOT) and polystyrene sulfonic acid (PSS) as a combination of the conjugated conductive organic polymer and the polyanion.

In the electric resistance film 1 of this embodiment, a dopant may be used in combination with the conductive organic polymer to control the electric conductivity of the conductive organic polymer and match the input impedance of the electromagnetic-wave absorbing sheet to the impedance in the air. Examples of the dopant include halogens such as iodine and chlorine, Lewis acids such as BF$_3$ and PF$_5$, proton acids such as nitric acid and sulfuric acid, transition metals, alkali metals, amino acids, nucleic acids, surfactants, pigments, chloranil, tetracyanoethylene, and TCNQ. More specifically, it is preferable to set the surface electric resistance of the electric resistance film 1 to about plus or minus several percent of 377Ω. The blending ratio between the conductive organic polymer and the dopant may be, e.g., conductive polymer:dopant=1:2 to 1:4 in mass ratio.

It is preferred that the electric resistance film 1 further contains polyvinylidene fluoride.

Polyvinylidene fluoride functions as a binder in the conductive organic polymer film by being added to a composition for coating the conductive organic polymer, thereby improving film formability while enhancing the adhesion with a base.

Moreover, it is preferred that the electric resistance film 1 further contains water-soluble polyester. Since the water-soluble polyester is highly compatible with the conductive polymer, it can fix the conductive polymer in the electric resistance film 1 by being added to the coating composition of the conductive organic polymer constituting the electric resistance film 1, thereby allowing the film to be more homogeneous. As a result of the use of the water-soluble polyester, the surface electric resistance is less likely to change even in more severe high temperature and high humidity environments, and it is possible to maintain a state in which the impedances between the electromagnetic-wave absorbing sheet and the air are matched.

Since the electric resistance film 1 including polyvinylidene fluoride and water-soluble polyester can have higher weather resistance, the change in the surface electric resistance of the electric resistance film 1 over time is reduced, and it is possible to constitute a highly reliable electromagnetic-wave absorbing sheet that can maintain stable electromagnetic-wave absorbing properties.

The content of the conductive organic polymer in the electric resistance film 1 is preferably 10 mass % or more and 35 mass % or less based on the total mass of the solid content in the composition of the electric resistance film 1. If the content of the conductive organic polymer is less than 10 mass %, the conductivity of the electric resistance film 1 tends to decrease. If the surface electric resistance of the electric resistance film 1 is set within a predetermined range for impedance matching, the thickness of the electric resistance film 1 tends to increase, which increases the thickness of the electromagnetic-wave absorbing sheet as a whole and deteriorates optical characteristics such as light transmittance. Meanwhile, if the content of the conductive organic polymer exceeds 35 mass %, the coating appropriateness at the time of coating the electric resistance film 1 tends to decrease due to the structure of the conductive organic polymer, which makes it difficult to form a favorable electric resistance film 1, increases the haze of the electric resistance film 1, and deteriorates optical characteristics.

The electric resistance film 1 can be formed by applying the coating composition that is a coating material for forming the electric resistance film onto a base and drying it as described above.

The application method of the coating material for forming the electric resistance film onto a base may be, e.g., bar coating, reverse coating, gravure coating, smaller diameter gravure coating, die coating, dip coating, spin coating, slit coating, or spray coating. Drying after the application is not particularly limited as long as it is performed under the condition that allows a solvent component of the coating material for forming the electric resistance film to evaporate, but it is preferably performed at 100° C. to 150° C. for 5 to 60 minutes. If a solvent remains in the electric resistance film 1, the strength tends to deteriorate. The drying method may be, e.g., hot-air drying, heat drying, vacuum drying, or natural drying. The electric resistance film 1 may be formed by curing the coated film by irradiation with UV light (ultraviolet light) or EB (electron beams) as needed.

The base to be used for forming the electric resistance film 1 is not particularly limited, but it is preferably a transparent base having light transmittance. Various materials such as resin, rubber, glass, and ceramics can be used as the material of the transparent base.

By forming the electric resistance film 1 having a surface electric resistance of 377 Ω/sq using the conductive organic polymer, the input impedance of the electromagnetic-wave absorbing sheet of this embodiment can be matched to the impedance in the air. Thereby, reflection or scattering of electromagnetic waves on the surface of the electromagnetic-wave absorbing sheet can be reduced, and more favorable electromagnetic-wave absorbing properties can be obtained.

[Dielectric Layer]

The dielectric layer 2 of the electromagnetic-wave absorbing sheet of this embodiment can be formed of a dielectric such as polyvinylidene fluoride, polyester resin, glass, transparent silicone rubber, or transparent OCA or OCR. The dielectric layer 2 may be a single layer formed of one material, or a stack of two or more layers formed of the same material or different materials. The formation method of the dielectric layer 2 may be, e.g., an application method, press molding, or extrusion molding.

As described above, the electromagnetic-wave absorbing sheet of this embodiment is an electromagnetic-wave interference type (λ/4 type) electromagnetic-wave absorbing sheet that absorbs electromagnetic waves by shifting the phase of electromagnetic waves incident upon the electromagnetic-wave absorbing sheet and the phase of reflected waves reflected by the electromagnetic-wave shielding layer by ½ wavelength to make the incident waves and the reflected waves cancel each other out. Therefore, the thickness of the dielectric layer (d in FIG. 1) is determined corresponding to the wavelength of electromagnetic waves to be absorbed.

Incidentally, the formula $d=\lambda/4$ is established when an interspace between the electric resistance film 1 and the electromagnetic-wave shielding layer 3 is a space, i.e., the dielectric layer 2 is constituted by air. When the dielectric layer 2 is formed of a material having permittivity $\varepsilon_r$, the thickness d becomes $d=\lambda/(4\sqrt{\varepsilon_r})$. By using as a material constituting the dielectric layer 2 a material having large permittivity, the thickness d of the dielectric layer 2 can be reduced by $1/\sqrt{\varepsilon_r}$, and the thickness of the electromagnetic-wave absorbing sheet as a whole can be reduced. Since the electromagnetic-wave absorbing sheet of this embodiment has flexibility, it is more preferred that the dielectric layer 2 constituting the electromagnetic-wave absorbing sheet and the electromagnetic-wave absorbing sheet itself are as thin as possible to make the sheet bent more easily. Further, considering that the electromagnetic-wave absorbing sheet of this embodiment is often to be attached via the adhesive layer 4 (described later) or the like to a member whose electromagnetic wave leakage is desired to be prevented, it is preferred that the electromagnetic-wave absorbing sheet is thin to easily conform to the shape of an attachment part and lightened further.

As compared with the case of arranging the electric resistance film 1 at a position λ/4 away from the electromagnetic-wave shielding layer 3, the thickness d can be $d=\lambda/(4\sqrt{\varepsilon_r})$ by using the dielectric layer 2 having permittivity $\varepsilon_r$ between the electromagnetic-wave shielding layer 3 and the electric resistance film 1, whereby the thickness of the dielectric layer 2 can be reduced. In this manner, by adjusting the permittivity $\varepsilon_r$ and the thickness of the dielectric layer 2, it is possible to control the wavelength of electromagnetic waves to be absorbed by the electromagnetic-wave absorbing sheet including the dielectric layer 2.

[Electromagnetic-Wave Shielding Layer]

The electromagnetic-wave shielding layer 3 of the electromagnetic-wave absorbing sheet of this embodiment reflects electromagnetic waves incident from the surface film 1, which is disposed opposite to the electromagnetic-wave shielding layer 3 via the dielectric layer 2 in the electromagnetic-wave absorbing sheet.

It is necessary that the electromagnetic-wave shielding layer 3 has flexibility so that it bends following at least the electric resistance film 1 and the dielectric layer 2 while having light transmittance.

The electromagnetic-wave shielding layer 3 that satisfies such a demand may be a conductive mesh constituted by conductive fibers. In one example, the conductive mesh can be formed by depositing a metal on a mesh woven from polyester monofilaments to impart conductivity to the mesh. The metal may be highly conductive metal such as copper or silver. Further, in order to reduce reflection by the metal film covering the mesh surface, a product in which a black antireflective layer is further provided on the outer side of the metal film is also on the market.

In addition to the above, the electromagnetic-wave shielding layer 3 may be a conductive grid constituted by fine metal wires (e.g., copper wires) having a diameter of several tens to several hundreds μm, which are arranged horizontally and vertically.

In order to obtain flexibility and light transmittance, the thickness of the electromagnetic-wave shielding layer 3 constituted by the conductive mesh or conductive grid is set to minimal within a range in which the electromagnetic-wave shielding layer 3 can have a desired surface electric resistance. If the fibers of the conductive mesh or the wires of the conductive grid are damaged or cut, it becomes difficult to obtain a desired surface electric resistance. To avoid this, a reinforcing layer and a protective layer made of resin having light transmittance may be formed on the back side of the conductive grid so that the electromagnetic-wave shielding layer 3 is configured as a stack of an electromagnetic-wave reflecting part made of a conductive material and a film constituting part made of resin.

[Adhesive Layer]

By providing the adhesive layer 4 in the electromagnetic-wave absorbing sheet of this embodiment, the electromagnetic-wave absorbing sheet as a stack of the electric resistance film 1, the dielectric layer 2 and the electromagnetic-wave shielding layer 3 can be attached to a desired position such as an inner surface of a housing that contains an electric circuit, or an inner surface or outer surface of an electric device. Specifically, since the electromagnetic-wave absorbing sheet of this embodiment has flexibility, it can be attached easily on a curved surface (bent surface). Thus, the adhesive layer 4 provided on the back surface of the sheet improves the handleability of the electromagnetic-wave absorbing sheet.

The adhesive layer 4 may be formed of a known material generally used as an adhesive layer such as an adhesive tape, and specific examples of which include an acrylic adhesive, a rubber adhesive, and a silicone adhesive. A tackifier or crosslinking agent may be used to adjust the tackiness with respect to an adherend and to reduce adhesive residues. The tackiness with respect to an adherend is preferably 5 N/10 mm to 12 N/10 mm. If the tackiness is smaller than 5 N/10 mm, the electromagnetic-wave absorbing sheet may be easily peeled off or displaced from an adherend. If the tackiness is larger than 12 N/10 mm, the electromagnetic-wave absorbing sheet is difficult to be peeled off from an adherend.

The thickness of the adhesive layer 4 is preferably 20 μm to 100 μm. If the adhesive layer 4 is thinner than 20 μm, the tackiness is low and the electromagnetic-wave absorbing sheet may be easily peeled off or displaced from an adherend. If the adhesive layer 4 is thicker than 100 μm, the electromagnetic-wave absorbing sheet is difficult to be peeled off from an adherend. If the cohesion of the adhesive layer is low, an adhesive may remain on an adherend when the electromagnetic-wave absorbing sheet is peeled off from the adherend, and the flexibility of the electromagnetic-wave absorbing sheet as a whole may decrease.

The adhesive layer 4 to be used in the electromagnetic-wave absorbing sheet of this embodiment may be an adhesive layer 4 that makes the electromagnetic-wave absorbing sheet unpeelably attached to an adherend, or an adhesive layer 4 that makes the electromagnetic-wave absorbing sheet peelably attached to an adherend. Further, as described above, the adhesive layer 4 is not essential in the electromagnetic-wave absorbing sheet of this embodiment, and various conventional adhesion methods can be adopted to attach the electromagnetic-wave absorbing sheet to a desired member.

[Protective Layer]

In the electromagnetic-wave absorbing sheet of this embodiment, the protective layer 5 may be provided on a surface of the electric resistance film 1 on the electromagnetic-wave incident side.

In the electromagnetic-wave absorbing sheet of this embodiment, the surface electric resistance of the conductive organic polymer used as the electric resistance film 1 may change due to humidity in the air. By providing the protective layer 5 on the surface of the electric resistance film 1, the influence of humidity can be reduced, and the electromagnetic-wave absorbing properties obtained by impedance matching can be effectively prevented from deteriorating.

In one example, the protective layer 5 in the electromagnetic-wave absorbing sheet of this embodiment can be polyethylene terephthalate having a thickness of 25 μm, which is attached on the surface of the electric resistance film 1 using an adhesive of a resin material.

By configuring the protective layer 5 to cover the entire surface of the electric resistance film 1, it is possible to prevent the influence of moisture in the air on the electric resistance film 1. Further, it is considered that the surface electric resistance of the protective layer 5 formed as a resin film may affect the surface electric resistance of the electric resistance film 1 as a member connected in parallel with the electric resistance film 1. Because of this, if the protective layer 5 is not too thick, the influence given to the input impedance of the electromagnetic-wave absorbing sheet will be very little. It is also possible to set the surface electric resistance of the electric resistance film 1 to a more suitable value by taking into consideration the influence of the surface electric resistance of the protective layer 5 as an input impedance of the electromagnetic-wave absorbing sheet.

It is preferred that the thickness of the protective layer 5 is as thin as possible within a range that can protect the electric resistance film 1. Specifically, the thickness of the protective layer 5 is preferably 150 μm or less, and more preferably 100 μm or less. If the thickness of the protective layer exceeds 150 μm, electromagnetic-wave absorbency may decrease and the electromagnetic-wave absorption amount may be lower than 20 dB, and the thickness of the electromagnetic-wave absorbing sheet as a whole increases and the flexibility decreases.

EXAMPLES

Electromagnetic-wave absorbing sheets of this embodiment were actually produced to measure various properties. The following describes the results.

<Weather Resistance of Electric Resistance Film>

Five each of the following two kinds of electromagnetic-wave absorbing sheets were produced by differentiating the components of electric resistance film liquids (liquids for forming electric resistance film).

(Sheet 1)

An electric resistance film liquid of Sheet 1 was prepared by adding and mixing the following components.

| | |
|---|---|
| (1) Conductive polymer dispersing element<br>Conductive polymer (PEDOT-PSS) manufactured by Heraeus Holding:<br>PH-100 (trade name),<br>Solid content concentration: 1.2 mass % | 36.7 parts |
| (2) PVDF dispersion<br>LATEX 32 (trade name) manufactured by Arkema S.A.,<br>Solid content concentration: 20 mass %, Solvent: Water | 5.6 parts |
| (3) Water-soluble polyester aqueous solution<br>PLAS COAT Z561 (trade name) manufactured by<br>GOO CHEMICAL CO., LTD.,<br>Solid content concentration: 25 mass % | 0.6 parts |
| (4) Organic solvent (dimethylsulfoxide) | 9.9 parts |
| (5) Watar-soluble solvent (ethanol) | 30.0 parts |
| (6) Water | 17.2 parts |

(Sheet 2)

An electric resistance film liquid of Sheet 2 was prepared by adding and mixing the following components.

| | |
|---|---|
| (1) Conductive polymer dispersing element<br>Conductive polymer (PEDOT-PSS) manufactured by Heraeus Holding:<br>PH-1000 (trade name), Solid content concentration:<br>1.2 mass % | 33.7 parts |

| | |
|---|---|
| (2) PVDF dispersion<br>LATEX 32 (trade name) manufactured by Arkema SA.,<br>Solid content concentration: 20 mass %, Solvent: Water | 5.1 parts |
| (3) Organic solvent (dimethylsulfoxide) | 9.5 parts |
| (4) Watar-soluble solvent (n-propyl alcohol) | 36.0 parts |
| (5) Water | 15.7 parts |

Each electric resistance film was formed by applying the electric resistance film liquid in the proportion described above onto a polyethylene terephthalate sheet (25 μm thick, base) by bar coating, in an amount so that the thickness after drying would be about 120 nm, and the applied liquid was heated at 150° C. for five minutes. The surface electric resistances of the electric resistance films thus produced were all 377 Ω/sq.

An urethane rubber having a thickness of 400 μm was used as the dielectric layer, and an aluminum foil having a thickness of 15 μm was used as the electromagnetic-wave shielding layer. The electric resistance film, the dielectric layer, and the aluminum foil were stacked in close contact with each other and attached to each other using an adhesive.

(Test Conditions)

The initial surface electric resistances of Sheet 1 (n=5) and Sheet 2 (n=5) produced above were measured. Next, all of the electromagnetic-wave absorbing sheets were placed in a thermo-hygrostat and stored for 500 hours at 60° C. under a relative humidity of 90%. Subsequently, the surface electric resistances of the electric resistance films of the electromagnetic-wave absorbing sheets after storage were measured. Then, surface electric resistance change rates were calculated based on the formula below, and an average of the surface electric resistance change rates of the five (n=5) electromagnetic-wave absorbing sheets was calculated.

Surface electric resistance change rate (%)=[(Surface electric resistance after storage−Initial surface electric resistance)/Initial surface electric resistance]×100

As a result of the above measurement, the average of the surface electric resistance change rates of the five (n=5) electromagnetic-wave absorbing sheets was 8% for Sheet 1 and 18% for Sheet 2. The surface electric resistance change rate of 8% of Sheet 1 corresponds to about 30Ω with respect to 377Ω, which is judged that Sheet 1 has high stability in practical use, considering the severe weather resistance test conditions. The surface electric resistance change rate of 18% of Sheet 2 corresponds to about 68Ω with respect to 377Ω, which is judged that Sheet 2 has enough stability in practical use.

The results of the weather resistance test using Sheet 1 and Sheet 2 indicate that the hygroscopicity of the electric resistance film is lowered by adding the water-soluble polyester aqueous solution to the electric resistance film, and thereby it is possible to constitute an electromagnetic-wave absorbing sheet having stable electromagnetic-wave absorbing properties with less surface electric resistance change.

<Effects of Impedance Matching>

Next, the change in the electromagnetic-wave absorbing properties depending on the surface electric resistance of the electric resistance film in the electromagnetic-wave absorbing sheet of this embodiment was examined by actually producing electromagnetic-wave absorbing sheets (Sheet 3 to Sheet 6) including electric resistance films with different surface electric resistances.

(Production of Sheets)

Electromagnetic-wave absorbing sheets were produced in the following manner. Electric resistance films having different thicknesses were formed by applying the electric resistance film liquid of Sheet 1 onto a 300-μm-thick polyethylene terephthalate (base) in different thicknesses by bar coating, followed by heating at 150° C. for five minutes. Then, a 250-μm-thick polyethylene terephthalate sheet was attached to a surface of the polyethylene terephthalate (base) using an adhesive on a side opposite to the side where the electric resistance film layer was formed. As a result, the dielectric layer 2 of polyethylene terephthalate having a thickness of 550 μm was formed. A 15-μm-thick aluminum foil was used as the electromagnetic-wave shielding layer 3. The center frequency of electromagnetic waves to be absorbed by each of the electromagnetic-wave absorbing sheets thus produced was 76 GHz.

The thicknesses and surface electric resistances of the electric resistance film layers after drying of the electromagnetic-wave absorbing sheets were as below.

(Sheet 3) Electric resistance film layer, thickness: 140 nm, surface electric resistance: 320 Ω/sq (Sheet 4) Electric resistance film layer, thickness: 92 nm, surface electric resistance: 452 Ω/sq (Sheet 5) Electric resistance film layer, thickness: 15 nm, surface electric resistance: 302 Ω/sq (Sheet 6) Electric resistance film layer, thickness: 88 nm, surface electric resistance: 471 Ω/sq (Measurement of Electromagnetic-Wave Absorbing Properties)

The electromagnetic-wave absorbing properties of Sheet 3 to Sheet 6 produced above as well as Sheet 1, which is the electromagnetic-wave absorbing sheet including the electric resistance film having a surface electric resistance of 377 Ω/sq (the same as the impedance in the air), were measured in accordance with a free space method. Specifically, a free space measuring device manufactured by KEYCOM Corporation and a vector network analyzer MS4647 B (trade name) manufactured by ANRITSU CORPORATION were used to determine, as a voltage, a ratio between the intensity of incident waves and the intensity of reflected waves at the time of irradiating each of the electromagnetic-wave absorbing sheets with electromagnetic waves.

Figure 2:
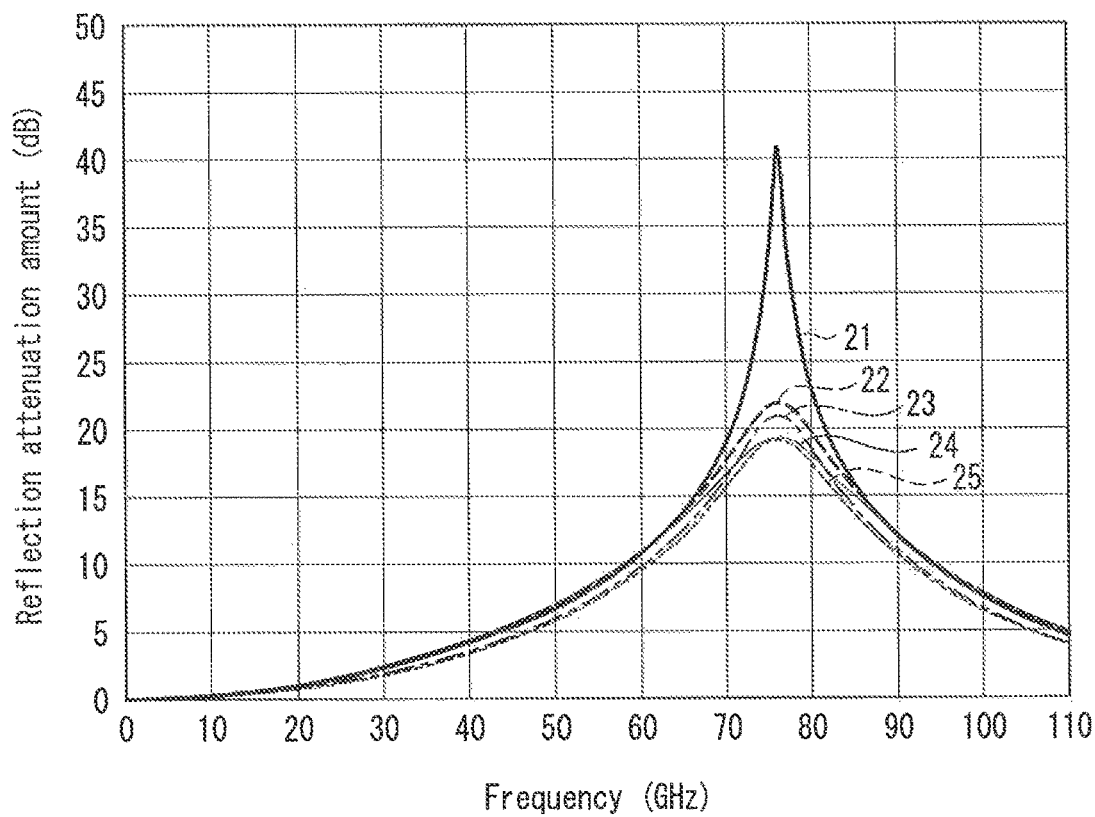
FIG. 2 is a graph indicating electromagnetic-wave absorbing properties of electromagnetic-wave absorbing sheets including electric resistance films having different surface electric resistances.

FIG. 2 indicates electromagnetic-wave absorbing properties of each of the electromagnetic-wave absorbing sheets measured in the above-described manner. In FIG. 2, the attenuation amount of the intensity of reflected waves with respect to the intensity of incident waves is expressed in dB.

In FIG. 2, reference numeral 21 indicates the electromagnetic-wave absorbing properties of Sheet 1, reference numeral 22 indicates the electromagnetic-wave absorbing properties of Sheet 3, reference numeral 23 indicates the electromagnetic-wave absorbing properties of Sheet 4, reference numeral 24 indicates the electromagnetic-wave absorbing properties of Sheet 5, and reference numeral 25 indicates the electromagnetic-wave absorbing properties of Sheet 6.

FIG. 2 indicates that Sheet 1, including the electric resistance film having a surface electric resistance of 377 &Ω/sq (matched the impedance in the air (vacuum)) and achieving extremely favorable impedance matching, resulted in extremely high attenuation amount of about 42 dB with respect to electromagnetic waves of 76 GHz.

Sheet 3, including the electric resistance film having a surface electric resistance of 320 Ω/sq (shifted by −15% from the vacuum impedance (377Ω)), resulted in the electromagnetic-wave attenuation amount of about 22 dB at 76

GHz, and Sheet 4, including the electric resistance film having a surface electric resistance of 452 Ω/sq (shifted by +20% from the vacuum impedance), resulted in the electromagnetic-wave attenuation amount of about 21 dB at 76 GHz Both of these sheets exceeded the electromagnetic-wave attenuation amount of 20 dB (attenuation rate: 99%) and exhibited favorable electromagnetic-wave absorbing properties.

Meanwhile, Sheet 5, including the electric resistance film having a surface electric resistance of 302 Ω/sq (shifted by −20% from the vacuum impedance (377Ω)), and Sheet 6, including the electric resistance film having a surface electric resistance of 471 Ω/sq (shifted by +25% from the vacuum impedance), both resulted in the electromagnetic-wave attenuation amount of about 19 dB at 76 GHz. It is considered that the attenuation amount of about 20 dB or more is practical electromagnetic-wave absorbing properties as the electromagnetic-wave absorbing sheet. By setting the surface electric resistance of the electric resistance film within a range from −15% to +20% with respect to the vacuum impedance, it is possible to obtain an electromagnetic-wave absorbing sheet having favorable electromagnetic-wave absorbing properties.

[Electromagnetic-Wave Shielding Layer]

Next, an electromagnetic-wave shielding layer having flexibility and light transmittance was examined.

An electric resistance film having an electric resistance of 377 Ω/sq was produced based on the production method of Sheet 1.

Specifically, each electric resistance film was formed by applying the electric resistance film liquid onto polyethylene terephthalate (10 μm thick, base) by bar coating, and the applied liquid was heated at 150° C. for five minutes. Then, a dielectric layer was formed using a 550-μm-thick transparent silicone rubber on a surface of the polyethylene terephthalate (base) on a side opposite to the side where the electric resistance film layer was formed.

An electromagnetic-wave shielding layer of Sheet 7 (Example 1) was formed using a conductive mesh Su-4X-27035 (trade name) manufactured by SEIREN Co., Ltd. An electromagnetic-wave shielding layer of Sheet 8 (Example 2) was formed using a conductive mesh Su-4G-9027 (trade name) manufactured by SEIREN Co., Ltd.

An electromagnetic-wave shielding layer of Sheet 9 (Comparative Example) was formed using a transparent conductive film PURE-OPT RN 3000 (trade name) manufactured by FUJIMORI KOGYO CO., LTD.

The electric characteristics and the optical characteristics of the electromagnetic-wave shielding layers in the electromagnetic-wave absorbing sheets were as below.
(Sheet 7) Surface electric resistance: 0.04 Ω/sq, total light transmittance: 30%, aperture ratio: 38%
(Sheet 8) Surface electric resistance: 0.11 Ω/sq, total light transmittance: 66%, aperture ratio: 82%
(Sheet 9) Surface electric resistance: 0.40 Ω/sq, total light transmittance: 77% or more The total light transmittance, the haze value and the electromagnetic-wave absorbing properties of each of the three electromagnetic-wave absorbing sheets thus produced were measured.

The total light transmittance and the haze value were measured using a Haze Meter NDH2000 (trade name) manufactured by NIPPON DENSHOKU INDUSTRIES Co., Ltd., in accordance with JIS K7105. A Light C was used as a light source.

The electromagnetic-wave absorbing properties were measured in accordance with the free space method described above. Specifically, a free space measuring device manufactured by KEYCOM Corporation and a vector network analyzer MS4647 B (trade name) manufactured by ANRITSU CORPORATION were used to determine, as a voltage, a ratio between the intensity of incident waves and the intensity of reflected waves at the time of irradiating each of the electromagnetic-wave absorbing sheets with electromagnetic waves.

Figure 3:
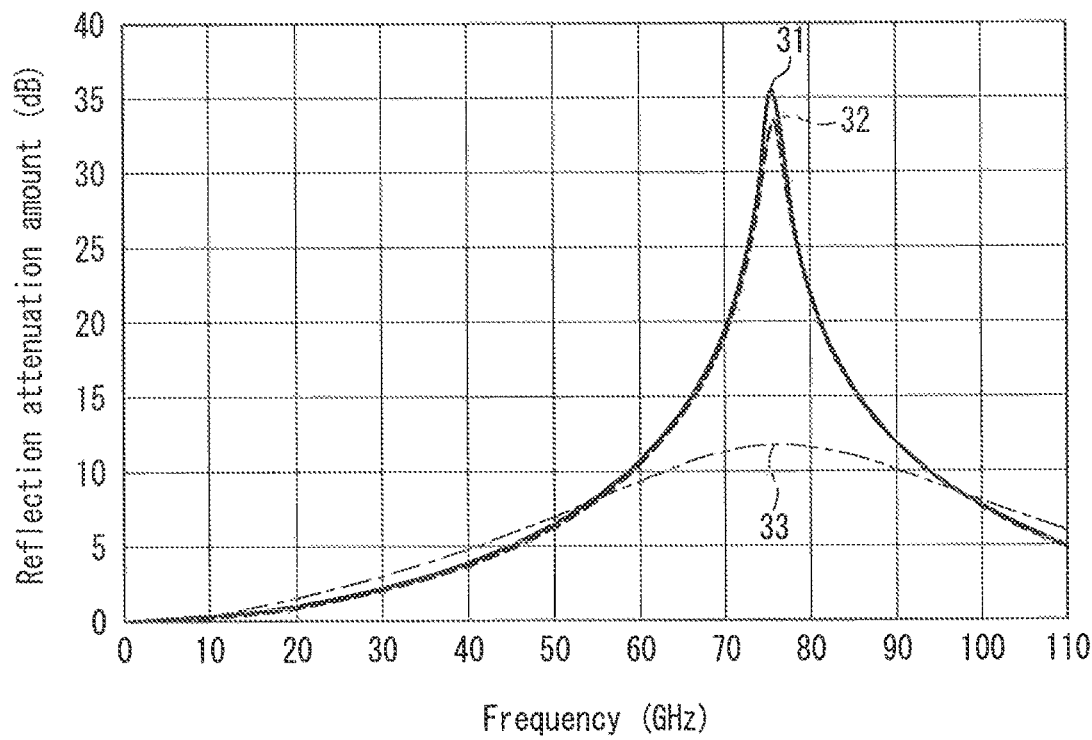
FIG. 3 is a graph indicating electromagnetic-wave absorbing properties of electromagnetic-wave absorbing sheets including different electromagnetic-wave shielding layers.

FIG. 3 indicates electromagnetic-wave absorbing properties of each of the electromagnetic-wave absorbing sheets measured in the above-described manner. In FIG. 3, the attenuation amount of the intensity of reflected waves with respect to the intensity of incident waves is expressed in dB.

In FIG. 3, reference numeral 31 indicates the electromagnetic-wave absorbing properties of Sheet 7, reference numeral 32 indicates the electromagnetic-wave absorbing properties of Sheet 8, and reference numeral 33 indicates the electromagnetic-wave absorbing properties of Sheet 9.

The optical characteristics of each of the electromagnetic-wave absorbing sheets were as follows: Sheet 7 had a total light transmittance of 30% and a haze value of 40; Sheet 8 had a total light transmittance of 66% and a haze value of 7; and Sheet 9 had a total light transmittance of 77% and a haze value of 8.

Here, a relationship between the aperture ratio and the surface electric resistance of the electromagnetic-wave shielding layer was simulated.

Figure 4:
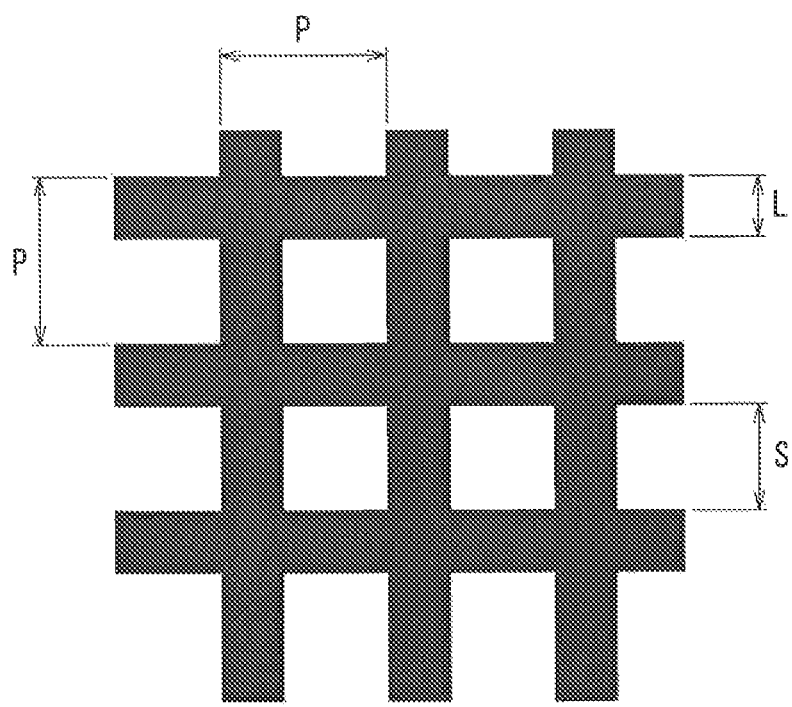
FIG. 4 is a model figure illustrating the shape of the electromagnetic-wave absorbing layer used for examining an aperture ratio.

FIG. 4 is a model figure illustrating the shape of the electromagnetic-wave absorbing layer used for the examination.

As illustrated in FIG. 4, it was assumed that the electromagnetic-wave absorbing layer was a grid metal mesh in which metal wires extend in vertical and horizontal directions. A change in the aperture ratio in accordance with the change in a pitch P of the metal wires and the conductance as the metal layer were calculated, by taking one square constituted by the metal wires (conductive material) as an inductance element (coil) as a loop.

More specifically, it was assumed that metal wires 27 μm in diameter were used. The aperture ratio of the electromagnetic-wave absorbing layer at this time is expressed by Formula (1) below, based on Pitch P=Wire diameter L+Space S between wires.

[Numerical Formula 1]

$$\text{Aperture Ratio} = \frac{S^2}{(S+L)^2} * 100 \quad (1)$$

When the attenuation amount of electromagnetic waves incident upon the platy electromagnetic-wave absorbing layer is expressed in dB as a shielding SE, it is expressed by Formula (2) below, where $Z_0$ represents the input and out impedance of the metal plate, $\sigma(\Omega^{-1} \cdot m^{-1})$ represents the conductance of the metal plate, and d(m) represents the plate thickness.

[Numerical Formula 2]

$$SE = 20\log\left|\frac{2+Z_0\sigma d}{2}\right| \quad (2)$$

Here, when each square of the metal mesh is regarded as a coil, and the resistance R=1/(σ·d) as the metal plate is replaced with jωL, the above Formula (2) can be converted to Formula (3) below.

[Numerical Formula 3]

$$SE = 20\log\left|\frac{2+\left(\frac{Z_0}{j\omega L}\right)}{2}\right| \quad (3)$$

$$= 20\log\left|\frac{\sqrt{1+\left(\frac{2\omega L}{Z_0}\right)^2}}{\left(\frac{2\omega L}{Z_0}\right)}\right|$$

Since ω is 2πL (ω=2πL), the electromagnetic-waves shielding SE can be expressed by Formula (4) below.

[Numerical Formula 4]

$$SE = 20\log\left|\frac{\sqrt{1+\left(\frac{4\pi f\cdot L}{Z_0}\right)^2}}{4\pi f\left(\frac{L}{Z_0}\right)}\right| \quad (4)$$

The aperture ratio (Formula (1)) and the shielding SE were measured by changing the pitch P of the wires constituting the metal mesh from 30 μm to 500 μm. It was found from this measurement that, in order to achieve the shielding SE of 20 dB, which corresponds to the attenuation amount of 99.9%, at electromagnetic wave frequencies of 60 to 90 GHz, the upper limit of the pitch P of the metal wires was substantially 170 μm as indicated in Table 1 below. At this time, the aperture ratio was 75%, and the total light transmittance considering wire bending was 60%.

Meanwhile, in order to achieve an electromagnetic-wave absorbing sheet having light transmittance, it is considered that the electromagnetic-wave absorbing layer is required to have a total light transmittance of 30% or more. The wire pitch P to achieve this was 50 μm, and the aperture ratio at this time was 35% and the shielding SE indicating the electromagnetic-wave attenuation amount was 45 dB.

TABLE 1

| Frequency | 60-90 GHz | |
| --- | --- | --- |
| Pitch P of metal wires | 170 μm | 50 μm |
| Aperture ratio | 75% | 35% |
| Transmittance | 60% | 30% |
| Shielding SE | 21.2 dB | 45.0 dB |

The above examination results of the electromagnetic-wave shielding effects in the electromagnetic-wave shielding layers and the optical characteristics of the electromagnetic-wave shielding layers of Sheets 7 and 8 indicate that the aperture ratio of 35% or more and 85% or less is a preferable condition in the case of using a conductive mesh or a conductive grid. The aperture ratio of 35% or more and 85% or less is a more preferable condition.

It is judged also from the result of Sheet 9 that the surface electric resistance is preferably 0.3 Ω/sq or less, and more preferably 0.11 Ω/sq or less to obtain favorable electromagnetic-wave reflecting properties as the electromagnetic-wave absorbing layer.

[Effect of Protective Layer]

Next, an effect obtained by stacking the protective layer on the surface of the electric resistance film was examined.

As an electromagnetic-wave absorbing sheet, Sheet 10 was formed using Sheet 1 described above and a 25-μm-thick polyethylene terephthalate sheet with an adhesive layer as a as a protective layer, and attaching the polyethylene terephthalate sheet to the surface of the electric resistance film.

Two each of Sheet 1 and Sheet 10 were prepared. The four electromagnetic-wave absorbing sheets in total were each subjected to a dry-wiping sliding test to measure the presence or absence of abrasion on the surface sheet member and the change in the surface electric resistance. The dry-wiping sliding test was performed using a HEIDON sliding test machine set with a white flannel cloth under the following conditions: weight: 2000 g, sliding rate: 4500 mm/min, sliding width: 25 mm, and sliding frequency: 1000 passes (about 10 minutes).

The electromagnetic-wave absorbing sheets after the test were observed. No abrasion was found visually on any of the two each of Sheet 1 and Sheet 10. As to the surface electric resistances of the electric resistance films of the electromagnetic-wave absorbing sheets, the two Sheets 10 provided with the protective layer had no change, whereas the two Sheets 1 not provided with the protective layer increased the surface electric resistance by 16% and 10%, respectively. The reason for this is considered to be that the electric resistance films of the electromagnetic-wave absorbing sheets not provided with the protective layer were scraped during the sliding test, and the thicknesses reduced and the surface electric resistances increased.

The above results confirmed the following. The change in the surface electric resistance of the electric resistance film collapses the impedance matching and deteriorates the electromagnetic-wave absorbing properties. By providing the protective layer, it is possible to reduce the change in the thickness of the electric resistance film due to mechanical factors and configure an electromagnetic-wave absorbing sheet having stable electromagnetic-wave absorbing properties.

[Confirmation of Flexibility]

Next, it was confirmed that, by using the conductive organic polymer as the electric resistance film, the electromagnetic-wave absorbing sheet of this embodiment can have flexibility.

Sheet 11 was produced as a comparative example. An electric resistance film of Sheet 11 having a surface electric resistance of 370 Ω/sq was formed by sputtering indium tin oxide (ITO). A dielectric layer and an electromagnetic-wave shielding layer of Sheet 11 were the same as those of Sheet 1.

Sheet 1 and Sheet 11 were each cut into a size of 5×10 cm, and their initial surface electric resistances were measured. Next, the sheets were placed on horizontally arranged six aluminum cylindrical rods (mandrels) 10 mm, 8 mm, 6 mm, 4 mm, 2 mm and 0.5 mm in diameter so that the electric resistance films would face upward. A weight of 300 g was attached to both ends of the sheets, and this state was maintained for 30 seconds. The both ends of the sheets were pulled downward with the center of the sheets being bent. Then, the surface electric resistances of the electromagnetic-wave absorbing sheets were measured.

Table 2 below indicates the measurement results.

TABLE 2

| | Diameter of cylindrical rod | | | | | |
|---|---|---|---|---|---|---|
| | 0.5 mm | 2 mm | 4 mm | 6 mm | 8 mm | 10 mm |
| Electric resistance film | PEDOT | PEDOT | PEDOT | PEDOT | PEDOT | PEDOT |
| Surface electric resistance of electric resistance film after wounded around rod | 370 Ω | 370 Ω | 370 Ω | 370 Ω | 370 Ω | 370 Ω |
| Surface condition | No change | No change | No change | No change | No change | No change |
| Electric resistance film | ITO | ITO | ITO | ITO | ITO | ITO |
| Surface electric resistance of electric resistance film after wounded around rod | ∞ | ∞ | | 750 Ω/sq | | 370 Ω |
| Surface condition | More cracks | More cracks | | With cracks | | No change |

As a result, in the case of the aluminum cylindrical rod 10 mm in diameter, the surface electric resistances of the electric resistance films of Sheet 1 and Sheet 11 did not change. In the case of the aluminum cylindrical rod 6 mm in diameter, the surface electric resistance of the electric resistance film of Sheet 1 did not change, but the surface electric resistance of the electric resistance film of Sheet 11 increased to 750 Ω/sq, which is about twice the initial surface electric resistance. In the cases of the aluminum cylindrical rods 2 mm and 0.5 mm in diameter, the surface electric resistance of the electric resistance film of Sheet 1 did not change, but the surface electric resistance of the electric resistance film of Sheet 11 became infinite and the film could no longer be used as the electric resistance film.

A microscope was used to observe the surface conditions of the electromagnetic-wave absorbing sheets wounded around the aluminum cylindrical rod 6 mm in diameter. No change was observed on the surface of Sheet 1, but cracks appeared on the surface of Sheet 11. Further, the surface conditions of the electromagnetic-wave absorbing sheets wounded around the aluminum cylindrical rod 0.5 mm in diameter were observed by the microscope. No change was observed on the surface of Sheet 1, but more cracks appeared on the surface of Sheet 11 than the surface of Sheet 11 wounded around the aluminum cylindrical rod 6 mm in diameter.

The above result confirmed that, by using the conductive organic polymer as the electric resistance film in the electromagnetic-wave absorbing sheet of this embodiment, the flexibility of the sheet improves and the electromagnetic-wave absorbing properties can be maintained even when a load that causes the sheet to strongly bend with a small diameter, is applied to the sheet.

As described above, in the electromagnetic-wave absorbing sheet of this embodiment, by constituting the electric resistance film to be arranged on the surface on the electromagnetic-wave incident side using the conductive organic polymer, electromagnetic-wave absorbing properties can be maintained even when the electromagnetic-wave absorbing sheet is strongly bent. Thus, it is possible to constitute an electromagnetic-wave absorbing sheet capable of exhibiting stable and high electromagnetic-wave absorbing properties while having flexibility and light transmittance. For example, the electromagnetic-wave absorbing sheet can be suitably used in a situation in which it is necessary to absorb undesired electromagnetic waves to avoid transmission of undesired electromagnetic waves while allowing a user to observe the conditions inside or outside the sheet, such as a curtain to create an electromagnetic-wave shielded room.

INDUSTRIAL APPLICABILITY

The electromagnetic-wave absorbing sheet disclosed in the present application is useful as an electromagnetic-wave absorbing sheet that can stably absorb electromagnetic waves in a high frequency band equal to or higher than the millimeter-wave band while having flexibility and light transmittance.

DESCRIPTION OF REFERENCE NUMERALS

1 Electric resistance film
2 Dielectric layer
3 Electromagnetic-wave shielding layer
4 Adhesive layer
5 Protective layer

The invention claimed is:

1. An electromagnetic-wave absorbing sheet having flexibility and light transmittance, comprising an electric resistance film, a dielectric layer and an electromagnetic-wave shielding layer that each have light transmittance and that are stacked sequentially,
  wherein the electric resistance film is formed of a conductive organic polymer,
  a content of the conductive organic polymer in the electric resistance film is 10 mass % or more and 35 mass % or less based on the total mass of the solid content, and
  the electromagnetic-wave shielding layer has an aperture ratio of 35% or more and 75% or less, and a shielding SE of 20 dB or more and 45 dB or less at electromagnetic frequencies of 60 to 90 GHz.

2. The electromagnetic-wave absorbing sheet according to claim 1, wherein the electromagnetic-wave shielding layer is formed of a conductive woven mesh.

3. The electromagnetic-wave absorbing sheet according to claim 1, wherein a surface electric resistance of the electromagnetic-wave shielding layer is 0.3 Ω/sq or less.

4. The electromagnetic-wave absorbing sheet according to claim 1, wherein the electric resistance film contains poly(3,4-ethylenedioxythiophene).

5. The electromagnetic-wave absorbing sheet according to claim 4, wherein the electric resistance film further contains polystyrene sulfonic acid and polyvinylidene fluoride.

6. The electromagnetic-wave absorbing sheet according to claim 4, wherein the electric resistance film further contains water-soluble polyester.

7. The electromagnetic-wave absorbing sheet according to claim 1, wherein a thickness of the dielectric layer is set so that the dielectric layer can absorb electromagnetic waves in a high frequency band equal to or higher than a millimeter-wave band.

8. The electromagnetic-wave absorbing sheet according to claim 1, wherein a surface electric resistance of the electric resistance film is in a range from −15% to +20% with respect to a vacuum impedance.

* * * * *